United States Patent
Fernando et al.

(10) Patent No.: US 9,024,420 B2
(45) Date of Patent: *May 5, 2015

(54) POWER QUAD FLAT NO-LEAD (PQFN) PACKAGE

(71) Applicant: International Rectifier Corporation, El Segundo, CA (US)

(72) Inventors: Dean Fernando, Torrance, CA (US); Roel Barbosa, Sta. Rosa Laguna (PH)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/076,467

(22) Filed: Nov. 11, 2013

(65) Prior Publication Data

US 2014/0061885 A1    Mar. 6, 2014

Related U.S. Application Data

(63) Continuation of application No. 13/034,519, filed on Feb. 24, 2011, now Pat. No. 8,587,101.

(60) Provisional application No. 61/459,527, filed on Dec. 13, 2010.

(51) Int. Cl.
  *H01L 23/495*     (2006.01)
  *H01L 23/00*      (2006.01)
  *H01L 23/31*      (2006.01)

(52) U.S. Cl.
  CPC ....... *H01L 23/49513* (2013.01); *H01L 23/3107* (2013.01); *H01L 23/4952* (2013.01);
  (Continued)

(58) Field of Classification Search
  USPC .............. 257/578, 677, 690, 723, E23.31, 257/E23.042, E23.051, E23.061, 676
  See application file for complete search history.

(56) References Cited

U.S. PATENT DOCUMENTS 5,998,856 A   12/1999   Noda
6,211,549 B1   4/2001   Funaki
(Continued)

FOREIGN PATENT DOCUMENTS

EP    2 463 904     6/2012
JP    H 9-102580    4/1997
(Continued)

OTHER PUBLICATIONS

U.S. Appl. No. 61/459,527, filed Dec. 13, 2010, Fernando.
(Continued)

*Primary Examiner* — Peniel M Gumedzoe
(74) *Attorney, Agent, or Firm* — Farjami & Farjami LLP

(57) ABSTRACT

Some exemplary embodiments of a multi-chip module (MCM) power quad flat no-lead (PQFN) semiconductor package utilizing a leadframe for electrical interconnections have been disclosed. One exemplary embodiment comprises a PQFN semiconductor package comprising a leadframe, a driver integrated circuit (IC) coupled to the leadframe, a plurality of vertical conduction power devices coupled to the leadframe, and a plurality of wirebonds providing electrical interconnects, including at least one wirebond from a top surface electrode of one of the plurality of vertical conduction power devices to a portion of the leadframe, wherein the portion of the leadframe is electrically connected to a bottom surface electrode of another of the plurality of vertical conduction power devices. In this manner, efficient multi-chip circuit interconnections can be provided in a PQFN package using low cost leadframes.

20 Claims, 4 Drawing Sheets

(52) U.S. Cl.
CPC .... *H01L23/49541* (2013.01); *H01L 23/49548* (2013.01); *H01L 23/49562* (2013.01); *H01L 23/49575* (2013.01); *H01L 24/32* (2013.01); H01L 2224/48091 (2013.01); H01L 2224/48247 (2013.01); H01L 2224/49171 (2013.01); H01L 2224/73265 (2013.01); H01L 2924/01029 (2013.01); H01L 2924/01033 (2013.01); H01L 2924/01047 (2013.01); H01L 2924/0105 (2013.01); H01L 2924/01079 (2013.01); H01L 2924/01082 (2013.01); *H01L 24/48* (2013.01); *H01L 24/49* (2013.01); H01L 2224/32245 (2013.01); H01L 2924/01005 (2013.01); H01L 2924/01006 (2013.01); H01L 2924/014 (2013.01); H01L 2924/13091 (2013.01); H01L 2224/45144 (2013.01); H01L 2224/45147 (2013.01); H01L 2924/13055 (2013.01); *H01L 24/45* (2013.01); H01L 2224/45015 (2013.01); H01L 2924/1306 (2013.01)

(56) References Cited

U.S. PATENT DOCUMENTS

| | | | |
|---|---|---|---|
| 6,249,024 | B1 | 6/2001 | Mangtani |
| 6,465,875 | B2 * | 10/2002 | Connah et al. ............... 257/666 |
| 6,610,923 | B1 | 8/2003 | Nagashima |
| 2001/0045627 | A1 | 11/2001 | Connah |
| 2003/0107120 | A1 * | 6/2003 | Connah et al. ............... 257/691 |
| 2004/0135248 | A1 | 7/2004 | Takagawa |
| 2004/0227547 | A1 | 11/2004 | Shiraishi |
| 2005/0054186 | A1 | 3/2005 | Kim |
| 2006/0113664 | A1 * | 6/2006 | Shiraishi et al. ............ 257/723 |
| 2007/0200537 | A1 | 8/2007 | Akiyama |
| 2007/0228534 | A1 | 10/2007 | Uno |
| 2008/0023831 | A1 | 1/2008 | Nishimura |
| 2008/0217662 | A1 | 9/2008 | Harnden |
| 2008/0252372 | A1 * | 10/2008 | Williams .................... 330/251 |
| 2009/0321927 | A1 | 12/2009 | Nishimura |
| 2010/0127683 | A1 | 5/2010 | Uno |
| 2011/0049685 | A1 | 3/2011 | Park |
| 2011/0169102 | A1 | 7/2011 | Uno |
| 2012/0126378 | A1 | 5/2012 | San Antonio |
| 2012/0273892 | A1 | 11/2012 | Uno |

FOREIGN PATENT DOCUMENTS

| | | |
|---|---|---|
| JP | 2009-27090 | 2/2009 |
| JP | 2011-29262 | 2/2011 |
| JP | 2012-175070 | 9/2012 |
| WO | WO 98/24128 | 6/1998 |

OTHER PUBLICATIONS

U.S. Appl. No. 61/774,484, filed Mar. 7, 2013, Fernando.
U.S. Appl. No. 61/774,506, filed Mar. 7, 2013, Fernando.
U.S. Appl. No. 61/774,535, filed Mar. 7, 2013, Fernando.
U.S. Appl. No. 61/774,541, filed Mar. 7, 2013, Fernando.
U.S. Appl. No. 61/777,341, filed Mar. 12, 2013, Fernando.
U.S. Appl. No. 61/777,753, filed Mar. 12, 2013, Fernando.
U.S. Appl. No. 61/780,069, filed Mar. 13, 2013, Fernando.
U.S. Appl. No. 61/780,417, filed Mar. 13, 2013, Fernando.
U.S. Appl. No. 61/782,460, filed Mar. 14, 2013, Fernando.
U.S. Appl. No. 13/034,519, filed Feb. 24, 2011, Fernando.
U.S. Appl. No. 13/662,244, filed Oct. 26, 2012, Fernando.
U.S. Appl. No. 14/102,275, filed Dec. 10, 2013, Fernando.
U.S. Appl. No. 14/102,316, filed Dec. 10, 2013, Fernando.
U.S. Appl. No. 14/102,379, filed Dec. 10, 2013, Fernando.
U.S. Appl. No. 14/140,285, filed Dec. 24, 2013, Fernando.
U.S. Appl. No. 14/147,464, filed Jan. 3, 2014, Fernando.
U.S. Appl. No. 14/150,469, filed Jan. 8, 2014, Fernando.
U.S. Appl. No. 14/152,640, filed Jan. 10, 2014, Fernando.
U.S. Appl. No. 14/152,723, filed Jan. 10, 2014, Fernando.
U.S. Appl. No. 14/152,816, filed Jan. 10, 2014, Fernando.

* cited by examiner

POWER QUAD FLAT NO-LEAD (PQFN) PACKAGE

This is a continuation of application Ser. No. 13/034,519 filed Feb. 24, 2011.

The present application claims the benefit of and priority to a provisional application entitled "Low Cost Leadframe Based High Power Density Full Bridge Power Device," Ser. No. 61/459,527 filed on Dec. 13, 2010. The disclosure in that provisional application is hereby incorporated fully by reference into the present application.

BACKGROUND OF THE INVENTION

1. Field of the Invention

The present invention relates generally to semiconductor devices. More particularly, the present invention relates to multi-chip packaging of semiconductor devices.

2. Background Art

Packages combining several semiconductor components into a single package can help simplify circuit design, reduce costs, and provide greater efficiency and improved performance by keeping related and dependent circuit components in close proximity. These integrated multi-chip device packages facilitate application integration and greater electrical and thermal performance compared to using discrete components. This trend towards greater circuit integration has resulted in the development and use of the power quad flat no-lead (PQFN) package, which can comprise a multi chip module (MCM) in larger form factors such as 12 mm by 12 mm. By exposing large surface area die pads on the bottom surface of the PQFN package, performance is optimized for high power density circuit applications requiring efficient thermal dissipation.

One of the advantages of the PQFN package is the low cost of fabrication, as a simple low cost leadframe is utilized for the base material rather than expensive multi-layered substrates. However, as a result of this single layer configuration, electrical wiring and routing becomes a particular challenge, particularly for larger and more complex multi chip modules supported by the 12 mm by 12 mm form factor. Package designs directly interconnecting power devices such as power MOSFETs and IGBTs using multilayer substrates are not possible using simple single layer leadframes. Since much of the top surface electrical interconnects must be by wirebonds, wire layouts must be carefully designed to prevent wire shorting. While increasing package thickness may reduce the risks of wire shorting, this is often undesirable for maintaining package reliability as the risk of package cracking may increase.

Thus, a unique cost-effective and reliable solution is needed to support the efficient design and operation of MCM PQFN packages.

SUMMARY OF THE INVENTION

A multi-chip module (MCM) power quad flat no-lead (PQFN) semiconductor package utilizing a leadframe for electrical interconnections, substantially as shown in and/or described in connection with at least one of the figures, and as set forth more completely in the claims.

DETAILED DESCRIPTION OF THE INVENTION

The present application is directed to a multi-chip module (MCM) power quad flat no-lead (PQFN) semiconductor package utilizing a leadframe for electrical interconnections. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1A:
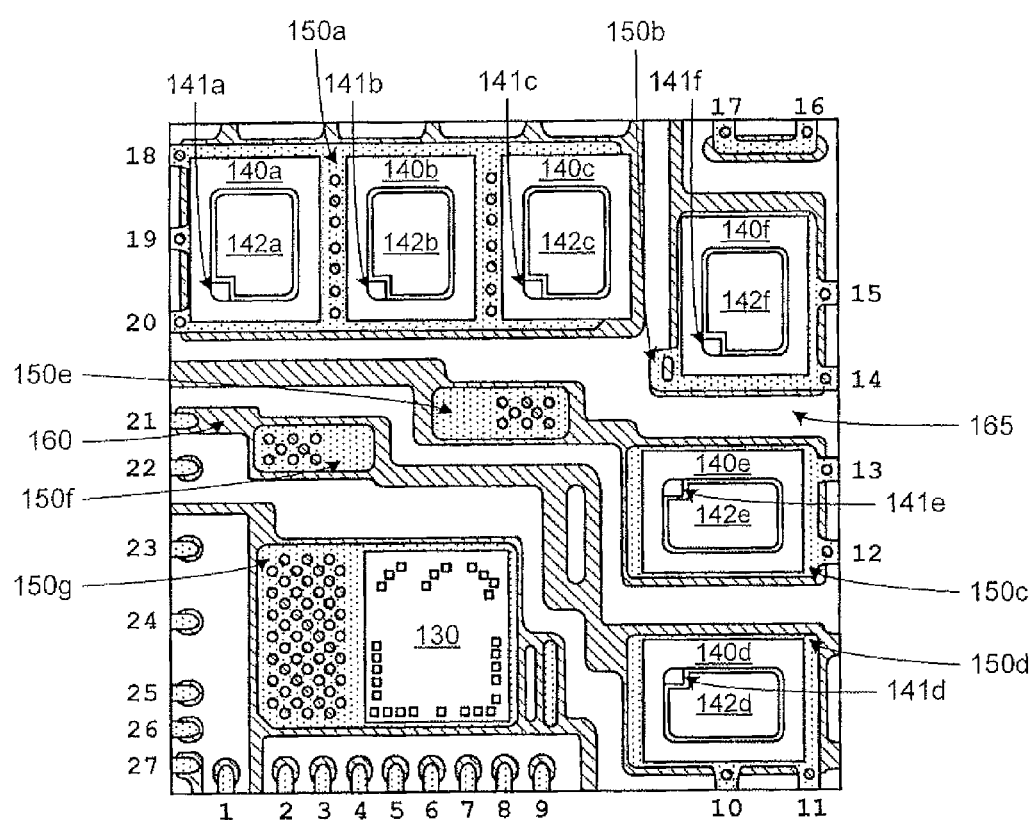
FIG. 1A illustrates a top-plan view of a semiconductor package according to an embodiment of the invention.

FIG. 1A illustrates a top-plan view of a semiconductor package according to an embodiment of the invention. In the present example, the semiconductor package may comprise a 12 mm by 12 mm PQFN package (i.e. having a "footprint" of 12 mm by 12 mm) with 27 external leads as numbered, or external leads 1, 2, 3, 4, 5, 6, 7, 8, 9, 10, 11, 12, 13, 14, 15, 16, 17, 18, 19, 20, 21, 22, 23, 24, 25, 26, and 27. However, alternative embodiments may utilize different package sizes and may include a different number of external leads, as required by application.

As shown in FIG. 1A, a driver integrated circuit (IC), or driver IC 130, is centrally located within the package. Driver IC 130 may comprise a high voltage IC (HVIC) driver suitable for driving six power devices in a full bridge configuration, such as the "5$^{th}$ generation" HVICs available from International Rectifier Corporation®. Thus, driver IC 130 may connect to gate electrodes 141a, 141b, 141c, 141d, 141e and 141f of respective vertical conduction power devices 140a, 140b, 140c, 140d, 140e and 140f, which may for example comprise power metal-oxide-semiconductor field effect transistors (power MOSFETs) such as fast-reverse epitaxial diode field effect transistors (FREDFETs), or insulated-gate bipolar transistors (IGBTs). For example, vertical conduction power devices 140a through 140c may comprise MOSFET devices forming the high side FETs of a full bridge power device, and vertical conduction power devices 140d through 140f may comprise MOSFET devices forming the low side FETs of the full bridge power device.

For purposes of clarity, wirebonds that may provide connections between driver IC 130 and vertical conduction power devices 140a through 140f have been omitted from FIG. 1A. Additionally, while a package providing a full bridge power device is illustrated in the Figures, alternative embodiments may provide other package device configurations as required by the particular application.

Leadframe 160 may comprise a material with high thermal and electrical conductivity such as the copper (Cu) alloy C194 available from Olin Brass®. Large areas of the bottom surface of leadframe 160 may be exposed for optimal electrical conductivity and thermal dissipation, as further shown and discussed in conjunction with FIG. 1C. The top surface of leadframe 160 may also be selectively plated with materials for enhanced adhesion to device dies and wires. For example, plating 150a, 150b, 150c, 150d, 150e, 150f and 150g may comprise silver (Ag) plating that is selectively applied to leadframe 160, which is available from companies such as QPL Limited. Mold compound 165 may comprise a low flexural modulus mold compound such as CEL9220ZHF 10 (v79) available from Hitachi® Chemical.

As shown in FIG. 1A, vertical conduction power devices 140a through 140c all share the same die pad positioned near the top edge of the package, and are coupled to leadframe 160 through plating 150a. Thus, the bottom drain electrodes of the high side MOSFETs are all connected together on the same die pad. On the other hand, vertical conduction power devices 140d through 140f comprising the low side MOSFETs are each placed on separate individual die pads near the adjacent right edge of the package. Solder or conductive adhesive, such as the silver filled QMI 529HT available from Henkel Corporation, may be utilized to attach the bottom surfaces of vertical conduction power devices 140a through 140c to plating 150a, vertical conduction power device 140d to plating 150d, vertical conduction power device 140e to plating 150c, vertical conduction power device 140f to plating 150b, and driver IC 130 to plating 150g.

Thus, driver IC 130 and vertical conduction power devices 140a through 140f are positioned in an optimized fashion within the package for electrical conductivity. To complete a full bridge power circuit in FIG. 1A, source electrode 142a is required to connect to the drain electrode of vertical conduction power device 140d, source electrode 142b is required to connect to the drain electrode of vertical conduction power device 140e, source electrode 142c is required to connect to the drain electrode of vertical conduction power device 140f, and source electrodes 142d, 142e, and 142f are required to be coupled together. However, routing wires directly to provide the necessary connections may result in wire crossing and potential wire shorting. Moreover, since the package is targeted for high power applications, the long lengths of wiring required may adversely affect electrical and thermal performance.

Figure 1B:
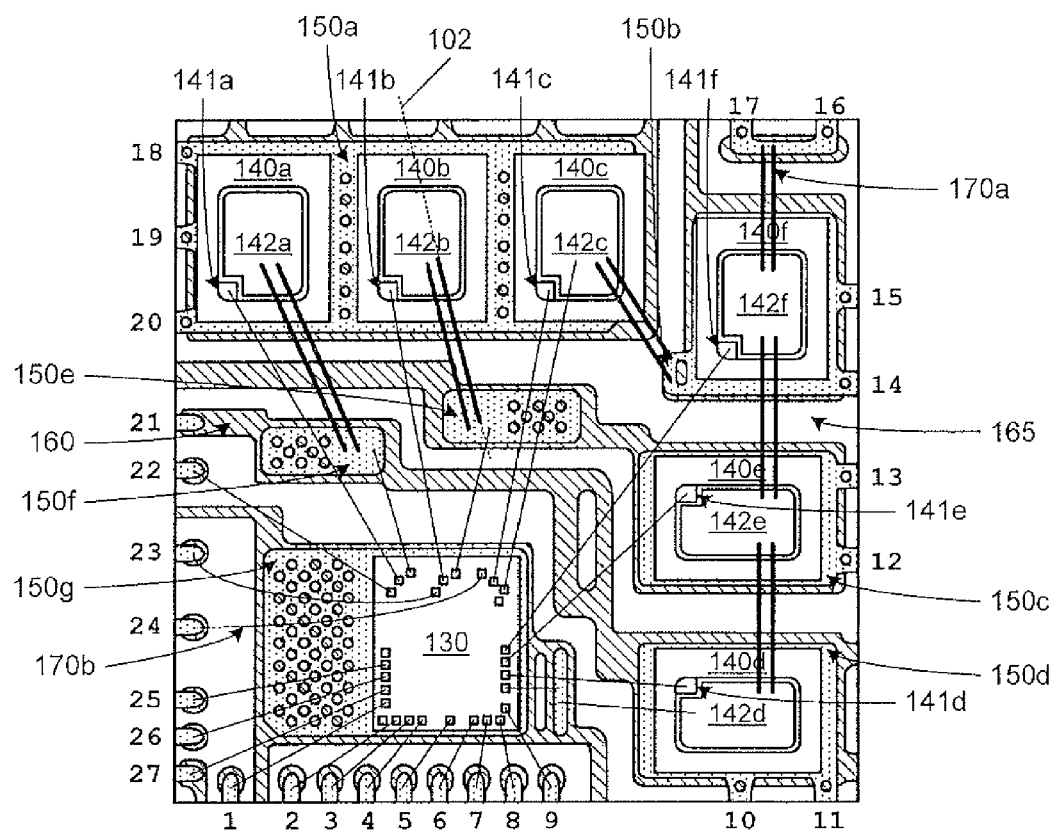
FIG. 1B illustrates a top-plan view of a semiconductor package including wirebonds according to an embodiment of the invention.

Thus, turning to FIG. 1B, FIG. 1B illustrates a top-plan view of a semiconductor package including wirebonds according to an embodiment of the invention. As shown in FIG. 1B, thin wires are utilized for gate connections, current sensing, and other I/O functions, as shown by representative wirebond 170b. These may comprise, for example, 1.3 mil diameter G1 type Gold (Au) wires. Thicker wires are utilized for power connections, as shown by representative wirebond 170a. These may comprise, for example, 2.0 mil diameter copper (Cu) wires, such as Maxsoft® LD wires available from Kulicke & Soffa®. Thicker wires such as wirebond 170a may be bonded using bond stitch on ball (BSOB) bonding. As shown in FIG. 1B, multiple wirebonds such as two wirebonds may be placed in parallel to provide additional current handling.

Thus, the required connections to complete the circuit from FIG. 1A and route to external leads 1 through 27 are provided by the wirebonds and leadframe 160, as shown in FIG. 1B. Gate electrodes 141a through 141f are each directly connected to driver IC 130 using gold wirebonds. Since vertical conduction power devices 140c and 140f are already in close proximity, a direct wirebond using a pair of copper wires can be made between source electrode 142c and plating 150b.

However, for connections between more distant devices, routing through leadframe 160 may be advantageous. Since leadframe 160 may comprise a material with high conductivity such as a copper alloy, leadframe 160 may provide a much more efficient path of conduction compared to direct wire routing. Additionally, issues such as the danger of wire shorts due to wire crossing are also avoided.

For example, to connect source electrode 142b to the drain electrode of vertical conduction power device 140e, a pair of thick copper wires is bonded between the top of source electrode 142b and the top of plating 150e. This connection is shown in more detail in conjunction with FIG. 2 discussed below, which shows a cross sectional view according to a slice provided by line 102. The leadframe 160 beneath plating 150e then connects to plating 150c to complete the connection to the drain electrode of vertical conduction power device 140e. In a similar manner, source electrode 142a is bonded via a pair of thick copper wires to plating 150f, which then connects via leadframe 160 to plating 150d connected to the drain electrode of vertical conduction power device 140d. Thus, the necessary electrical connections to complete the package are provided by using leadframe 160 as a routing apparatus, advantageously avoiding crossed wirebonds.

Figure 1C:
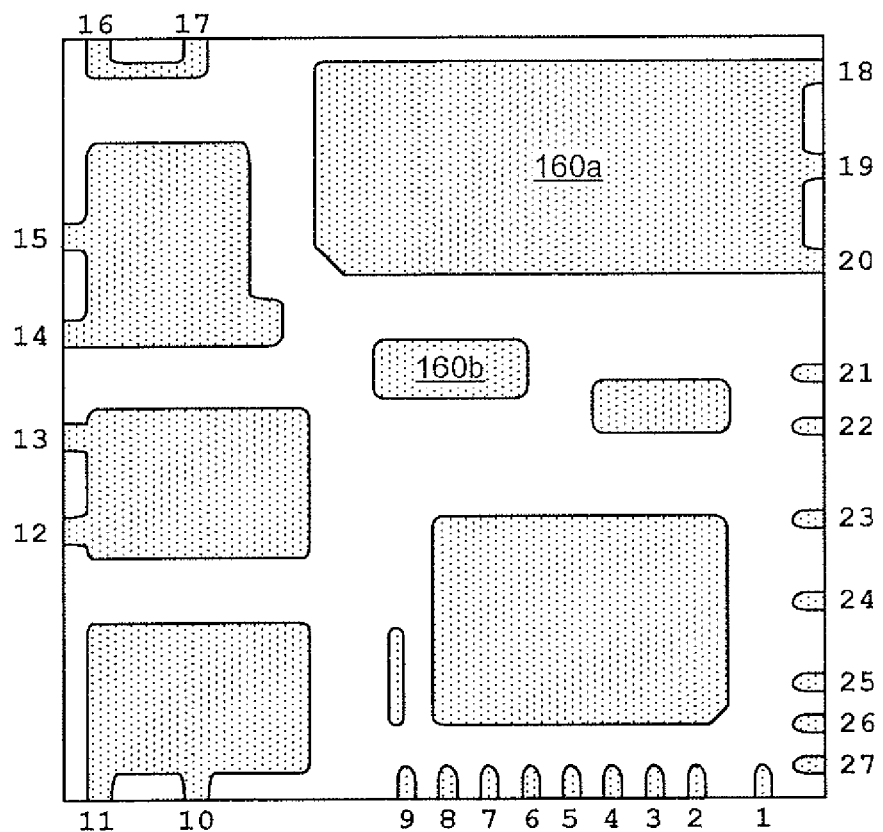
FIG. 1C illustrates a bottom-plan view of a semiconductor package according to an embodiment of the invention.

Moving to FIG. 1C, FIG. 1C illustrates a bottom-plan view of a semiconductor package according to an embodiment of the invention. By flipping the package shown in FIG. 1B, it may look similar in appearance to the layout shown in FIG. 1C, with the exposed portions of the leadframe visible. Thus, for example, leadframe portion 160a may correspond to the outline of plating 150a shown in FIG. 1B, and leadframe portion 160b may correspond to the outline of plating 150e shown in FIG. 1B. Thus, large areas of the package leadframe are exposed at the bottom for efficient heat dissipation and electrical conductivity. The exposed surface areas may also be plated, for example with Tin (Sn). By designing a printed circuit board (PCB) with matching lands accordingly, the efficient design of the PQFN package may be advantageously exploited.

Figure 2:
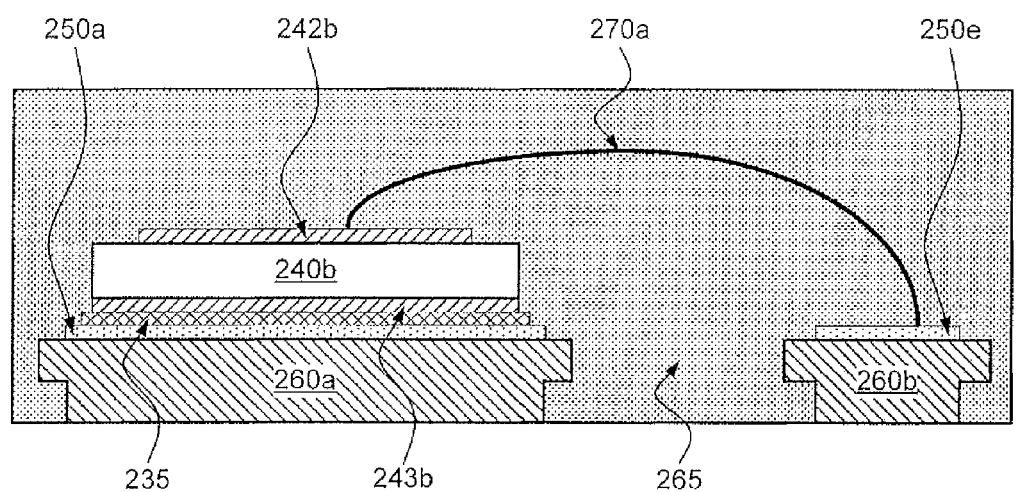
FIG. 2 illustrates a cross sectional view of a portion of a semiconductor package according to an embodiment of the invention.

Discussing FIG. 2, FIG. 2 illustrates a cross sectional view of a portion of a semiconductor package according to an embodiment of the invention. More specifically, the cross sectional view corresponds to the slice provided by line 102 from FIG. 1B. With respect to FIG. 2, leadframe portions 260a and 260b correspond to leadframe portions 160a and 160b from FIG. 1C, vertical conduction device 240b corresponds to vertical conduction device 140b from FIG. 1B, source electrode 242b corresponds to source electrode 142b from FIG. 1B, plating 250a corresponds to plating 150a from FIG. 1B, plating 250e corresponds to plating 150e from FIG. 1B, and mold compound 265 corresponds to mold compound 165 from FIG. 1B. It should be noted that FIG. 2 is not necessarily drawn to scale.

As shown in FIG. 2, drain electrode 243b of vertical conduction device 240b is coupled to leadframe portion 260a through conductive adhesive 235 and plating 250a. As previously discussed, conductive adhesive 235 may comprise a silver filled adhesive such as QMI 529HT. Source electrode 242b of vertical conduction device 240b is then coupled to leadframe portion 260b through wirebond 270a and plating 250e. Wirebond 270a may comprise a 2.0 mil diameter copper (Cu) wire that is BSOB bonded. As previously noted, multiple wirebonds may be provided for additional current handling, which are not shown in FIG. 2 since the pair of wirebonds shown in FIG. 1B are parallel to each other. After the device dies are adhered and the wirebonds are formed, the package may be encapsulated using mold compound 265. To provide resilience against package cracking, the height (or thickness) of the package as defined by mold compound 265 may be kept thin, such as 0.9 mm or less.

The cross section shown in FIG. 2 thereby illustrates the electrical connection provided by wirebond 270a to connect source electrode 142b and plating 150e as shown in FIG. 1B. The portion of leadframe 160 from FIG. 1B corresponding to leadframe portion 260b in FIG. 2 continues traveling to the right to connect to plating 150c, thereby completing the connection to the drain of vertical conduction power device 140e. A similar connection process also applies for source electrode 142a connecting to the drain of vertical conduction power device 140d.

Thus, a multi-chip module (MCM) power quad flat no-lead (PQFN) semiconductor package utilizing a leadframe for electrical interconnections has been described. According to the present invention, even complex packages with multiple power devices can be integrated by utilizing the low cost leadframe as an efficient electrical interconnect. The invention's innovative package allows for a compact form factor, improved electrical and thermal conductivity, enhanced reliability, and cost effective fabrication compared to conventional packaging techniques.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A power quad flat no-lead (PQFN) semiconductor package comprising:
    a leadframe comprising a plurality of die pads;
    a driver integrated circuit (IC) coupled to a top surface of a first die pad of said leadframe;
    a plurality of vertical conduction power transistors including a first group of vertical conduction power transistors coupled to a top surface of a common die pad of said leadframe and a second group of vertical conduction power transistors individually coupled to respective top surfaces of separate die pads of said leadframe;
    a top surface electrode of one of said first group of vertical conduction power transistors being electrically connected to a bottom surface electrode of one of said second group of vertical conduction power transistors;
    at least one wirebond providing direct electrical connection between said driver IC and one of said plurality of vertical conduction power transistors;
    wherein each of said first die pad, said common die pad and said separate die pads has a separate exposed surface on a bottom surface of said leadframe.

2. The PQFN semiconductor package of claim 1, wherein said PQFN semiconductor package is configured as a full bridge power device.

3. The PQFN semiconductor package of claim 1, wherein said leadframe is selectively plated with silver for enhanced adhesion.

4. The PQFN semiconductor package of claim 1, wherein said first group of vertical conduction power transistors is positioned near a first edge of said package, and wherein said second group of vertical conduction power transistors is positioned near a second edge of said package.

5. The PQFN semiconductor package of claim 1, wherein a footprint of the package is 12 mm by 12 mm or greater.

6. The PQFN semiconductor package of claim 1, wherein said plurality of vertical conduction power transistors comprises power MOSFETs.

7. The PQFN semiconductor package of claim 1, wherein said plurality of vertical conduction power transistors comprises IGBTs.

8. A power quad flat no-lead (PQFN) semiconductor package comprising:
    a leadframe;
    a driver integrated circuit (IC) coupled to a top surface of a first die pad of said leadframe;
    a plurality of vertical conduction power transistors including a plurality of high side transistors coupled to a top surface of a common die pad of said leadframe and a plurality of low side transistors coupled to respective top surfaces of individual die pads of said leadframe, a top surface electrode of one of said plurality of vertical conduction power transistors being electrically connected to a portion of said leadframe, wherein said portion of said leadframe is electrically connected to a bottom surface electrode of another of said plurality of vertical conduction power transistors;
    at least one wirebond providing direct electrical connection between said driver IC and a first of said plurality of vertical conduction power transistors;
    wherein each of said first die pad, said common die pad and said individual die pads has a separate exposed surface on a bottom surface of said leadframe.

9. The PQFN semiconductor package of claim 8, wherein said PQFN semiconductor package is configured as a full bridge power device.

10. The PQFN semiconductor package of claim 8, wherein said leadframe is selectively plated with silver for enhanced adhesion.

11. The PQFN semiconductor package of claim 8, wherein a footprint of the package is 12 mm by 12 mm or greater.

12. The PQFN semiconductor package of claim 8, wherein said plurality of vertical conduction power transistors has six (6) vertical conduction power transistors.

13. The PQFN semiconductor package of claim 8, wherein said plurality of vertical conduction power transistors comprises power MOSFETs.

14. The PQFN semiconductor package of claim 8, wherein said plurality of vertical conduction power transistors comprises IGBTs.

15. A power quad flat no-lead (PQFN) semiconductor package comprising:
    a leadframe:
    a driver integrated circuit (IC) coupled to a top surface of a first die pad of said leadframe;
    a plurality of vertical conduction power transistors including a first group of vertical conduction power transistors coupled to a top surface of a common die pad and a second group of vertical transistors coupled to respective top surfaces of individual die pads of said leadframe, a top surface electrode of one of said plurality of vertical conduction power transistors being electrically connected to a portion of said leadframe, wherein said portion of said leadframe is electrically connected to a bottom surface electrode of another of said plurality of vertical conduction power transistors;

at least one wirebond providing direct electrical connection between said driver IC and a first of said plurality of vertical conduction power transistors;

wherein each of said first die pad, said common die pad and said individual die pads has a separate exposed surface on a bottom surface of said leadframe.

16. The PQFN semiconductor package of claim 15, wherein said PQFN semiconductor package is configured as a full bridge power device.

17. The PQFN semiconductor package of claim 15, wherein said plurality of vertical conduction power transistors is divided into said first group positioned on said common die pad near a first edge of said PQFN semiconductor package and said second group positioned on said individual die pads near a second edge of said PQFN semiconductor package, said first group including said one of said plurality of vertical conduction power transistors and said second group including said another of said plurality of vertical conduction power transistors.

18. The PQFN semiconductor package of claim 15, wherein a footprint of the package is 12 mm by 12 mm or greater.

19. The PQFN semiconductor package of claim 15, wherein said plurality of vertical conduction power transistors comprises power MOSFETs.

20. The PQFN semiconductor package of claim 15, wherein said plurality of vertical conduction power transistors comprises IGBTs.

\* \* \* \* \*